United States Patent
Ohtake et al.

(10) Patent No.: US 6,939,787 B2
(45) Date of Patent: Sep. 6, 2005

(54) METHOD FOR FABRICATING SEMICONDUCTOR DEVICE HAVING GATE ELECTRODE WITH POLYMETAL STRUCTURE OF POLYCRYSTALLINE SILICON FILM AND METAL FILM

(75) Inventors: Fumio Ohtake, Kawasaki (JP); Yasushi Akasaka, Yokohama (JP); Atsushi Murakoshi, Kawasaki (JP); Kyoichi Suguro, Yokohama (JP)

(73) Assignees: Fujitsu Limited, Kawasaki (JP); Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/962,504

(22) Filed: Oct. 13, 2004

(65) Prior Publication Data

US 2005/0062115 A1 Mar. 24, 2005

Related U.S. Application Data

(62) Division of application No. 09/749,590, filed on Dec. 28, 2000, now abandoned.

(30) Foreign Application Priority Data

Dec. 28, 1999 (JP) ......................................... H11-373406

(51) Int. Cl.[7] .................. H01L 21/3205; H01L 21/4763
(52) U.S. Cl. ...................................... 438/592; 438/197
(58) Field of Search ................................ 438/197, 199, 438/585, 592

(56) References Cited

U.S. PATENT DOCUMENTS

| | | | | |
|---|---|---|---|---|
| 5,723,356 A | * | 3/1998 | Tsukamoto | 438/199 |
| 5,767,004 A | * | 6/1998 | Balasubramanian et al. | 438/592 |
| 5,877,074 A | | 3/1999 | Jeng et al. | 438/592 |
| 5,888,588 A | * | 3/1999 | Nagabushnam et al. | 427/248.1 |
| 6,080,645 A | | 6/2000 | Pan | 438/585 |
| 6,093,589 A | * | 7/2000 | Lo et al. | 438/197 |
| 6,107,147 A | * | 8/2000 | Kim et al. | 438/301 |
| 6,136,678 A | * | 10/2000 | Adetutu et al. | 438/592 |
| 6,165,883 A | * | 12/2000 | Hiura | 438/592 |
| 6,340,629 B1 | * | 1/2002 | Yeo et al. | 438/592 |
| 6,465,335 B1 | * | 10/2002 | Kunikiyo | 438/592 |
| 6,503,788 B1 | * | 1/2003 | Yamamoto | 438/231 |
| 2001/0000629 A1 | | 5/2001 | Tsukamoto | 438/585 |
| 2001/0002071 A1 | * | 5/2001 | Agarwal et al. | 257/751 |
| 2001/0005622 A1 | * | 6/2001 | Kim et al. | 438/592 |

OTHER PUBLICATIONS

T.S. Chao et al., Suppression of Boron Penetration in BF2+– implanted Poly–Si Gate Using N2O Oxide and Stacked Amorphous–Silicon (SAS) Structure. EDMS 1994, pp. 5–4–12 to 5–4–15.*

(Continued)

*Primary Examiner*—Anh Duy Mai
(74) *Attorney, Agent, or Firm*—Westerman, Hattori, Daniels & Adrian, LLP

(57) ABSTRACT

The semiconductor device comprises a pair of impurity diffused regions formed in a silicon substrate 10, spaced from each other, and a gate electrode 26 formed above the silicon substrate 10 between the pair of impurity diffused regions 38 intervening a gate insulation film 12 therebetween. The gate electrode 26 is formed of a polycrystalline silicon film 16 formed on the gate insulation film 12, a polycrystalline silicon film 30 formed on the polycrystalline silicon film 16 and having crystal grain boundaries discontinuous to the polycrystalline silicon film 16, a metal nitride film 20 formed on the polycrystalline silicon film 30, and a metal film 22 formed on the barrier metal film 20. Whereby diffusion of the boron from the first polycrystalline silicon film 16 toward the metal nitride film 20 can be decreased. Thus, depletion of the gate electrode 26 can be suppressed.

6 Claims, 14 Drawing Sheets

OTHER PUBLICATIONS

C–Y. Lin et al., A Comprehensive Study of Suppression of Boron Penetration by Amorphous–Si Gate in P+ Gate PMOS Devices. IEEE 1995, pp. 2080–2088.*

M.T. Takagi et al., A Novel 0.15 micron CMOS Technology Using W/WNx/Polysilicon Gate Electrode and Ti Silicided Source/Drain Diffusions. IEEE 1996, pp. 455–458.*

K. Kasai et al., W/WNx/Poly–Si Gate Technology for Future High Speed Deep Submicron CMOS LSIs. IEDM 1994, pp. 497–500.

Y. Akasaka et al., Low–Resitstivity Poly–Metal Gate Electrode Durable for High–Temperature Processing. IEEE 1996, pp. 1864–1869.

B. H. Lee et al., In–Situ Barrier Formation for High Reliable W/Barrier/Poly–Si Gate Using Denudation of WNx on Polycrystalline Si. IEDM 1998, pp. 385–388.

Y. Hiura et al., Integration Technology of Polymetal (W/WSiN/Poly–Si) Dual Gate CMOS for 1 Gbit DRAMs and Beyond. IEDM 1998, pp. 389–392.

* cited by examiner

METHOD FOR FABRICATING SEMICONDUCTOR DEVICE HAVING GATE ELECTRODE WITH POLYMETAL STRUCTURE OF POLYCRYSTALLINE SILICON FILM AND METAL FILM

This application is a divisional of prior application Ser. No.: 09/749,590 filed Dec. 28, 2000 now abandoned, the benefit of which is claimed under 35 U.S.C. §120.

BACKGROUND OF THE INVENTION

The present invention relates to a semiconductor device and a method for fabricating the semiconductor device, more specifically to a semiconductor device including gate electrodes of a polymetal structure having laid polycrystalline silicon films and metal films, and a method for fabricating the same.

Conventionally, the gate electrodes of MOSFETs have been formed of single polycrystalline silicon layered structures owing to the thermal stability, the compatibility of polycrystalline silicon with silicon of the substrates in its MOS characteristics, etc. Presently, the so-called polycide structure, which is formed of a silicide film deposited on a polycrystalline silicon film, is dominantly used for the end of decreasing sheet resistance of the gate electrodes while utilizing the above-described advantages of polycrystalline silicon. Logic devices and memory devices now on market have gate electrode structures of the polycide structure.

The gate electrodes of the MOSFETs of the current logic devices generally have layered structures of titanium silicide or cobalt silicide, and polycrystalline silicon. On the other hand, the gate electrodes of the MOSFETs of memory devices are formed of layered structures of tungsten silicide and polycrystalline silicon. This is because the logic device require no high-temperature and long-time heat processing after the gate electrodes have been formed, so that titanium silicide and cobalt silicide, which have low heat resistance but can sufficiently lower sheet resistance, are applicable to the gate electrode of the logic device for high-speed operation. On the other hand, the memory devices require the step of forming capacitors, which require high-temperature and long-time heat processing after the gate electrodes have been formed, so that tungsten silicide, which has higher sheet resistance than titanium silicide and cobalt silicide, but is superior to titanium silicide and cobalt silicide in heat resistance, is applicable to the gate electrode of the memory device compatibly with steps of forming the memory elements.

It is one reason for applying tungsten silicide to the memory devices that the peripheral circuits of the currently fabricated memory devices are CMOS circuits of the so-called single gates which include the gate electrodes of the N-channel transistors and the gate electrodes of the P-channel transistors formed of $N^+$ polycrystalline silicon. That is, the memory devices do not require high performance of the peripheral circuits, as do the logic devices, and accordingly it has not been much necessary to use the CMOS circuits of the so-called dual gates which include the gate electrodes of the N-channel transistors formed of $N^+$ polycrystalline silicon, and the gate electrodes of the P-channel transistors formed of $P^+$ polycrystalline silicon. Furthermore, diffusivity of dopants in tungsten silicide are several orders of magnitude higher than that in polycrystalline silicon, which has made it difficult to apply tungsten silicide to the CMOS circuits having the dual gates.

Recently, dual-gate CMOS technology is required even in peripheral circuits of memory devices in order to achieve high performance. However, high-performance circuits cannot be achieved in memory devices by using current dual-gate technology for LOGIC devices because of the poor thermal stability and severe inter-diffusion of gate dopants between $P^+$ gate and $N^+$ gate.

Presently, the so-called polymetal (polycrystalline silicon-metal) gate structures having a refractory metal and polycrystalline silicon laid on each other are considered. The polymetal structure has on polycrystalline silicon a layer of a refractory metal having higher heat resistance and lower sheet resistance than silicide, and can simultaneously satisfy low sheet resistance required by the logic devices, and heat resistance required by the memory devices.

A MOS transistor having the typical polymetal gate structure will be explained with reference to FIG. 12.

A gate electrode 104 is formed on a silicon substrate 100 intervening a gate insulation film 102 therebetween. The gate electrode 104 is formed of a layered structure of a polycrystalline silicon film 106 formed on the gate insulation film 102, a WN (tungsten nitride) film 108 formed on the polycrystalline silicon film 106 and a W (tungsten) film formed on the WN film 108. The WN film 108 is a barrier metal for preventing the polycrystalline silicon film 106 and the W film 110 from reacting with each other to thereby form tungsten silicide, which has high resistance. A cap film 112 of silicon nitride film is formed on the gate electrode 104. A silicon oxide film 114 is formed on the side walls of the polycrystalline silicon film 106. A sidewall insulation film 116 is formed on the side walls of the gate electrode 104. A source/drain diffused layer 122 formed of a low-concentration diffused region 118 and a high-concentration diffused region 120 is formed in the silicon substrate on both sides of the gate electrode 104.

The polymetal gate structure shown in FIG. 12 is much superior in heat resistance and in suppressing inter-diffusion of a dopant in the polycrystalline silicon film 106 in a case that the dual gate structure is adopted, whereby sheet resistance does not increase even after high-temperature and long-time heat processing and a threshold voltage of the transistors of the CMOS circuit does not change.

In the conventional method for fabricating the semiconductor device, an amorphous silicon film to be the polycrystalline silicon film 106 is deposited, boron is doped in the amorphous silicon film, the WN film 108 and the W film 10 are deposited, these laid films are patterned to form the gate electrode 104.

However, the semiconductor device having the polymetal structure fabricating by the above-described fabrication method often has depletion in the gate electrode 104 of the PMOSFET.

The inventors of the present application have made earnest studies of the depletion in the gate electrode 104 of the PMOSFET and has found for the first time that the depletion in the gate electrode 104 are caused by the fact that boron, a gate dopant of the PMOSFET is absorbed into the reaction layer between the WN film 108 as the barrier metal and the polycrystalline silicon film 106 to form B—N bonds, which lowers a boron concentration in the polycrystalline silicon film 106. The depletion in the gate electrode affect characteristics of the MOS transistor, and it is desirable to suppress the depletion as far as possible.

SUMMARY OF THE INVENTION

An object of the present invention is to provide a semiconductor device including a polymetal gate structure of the dual gate, which can suppress depletion in the gate electrode of a PMOSFET, and a method for fabricating the same.

The inventors of the present application have made earnest studies of causes of the depletion of the gate electrode 104 of the conventional semiconductor device shown in FIG. 12 and have found for the first time that the boron absorption of the WN film is due to B—N bonds formed by boron as a gate dopant being absorbed by the reaction layer between the WN film 108 as a barrier metal and the polycrystalline silicon film 106.

FIG. 13 is a graph of a boron distribution in the gate electrode of the conventional semiconductor device shown in FIG. 12 measured by secondary ion mass spectroscopy (SIMS). FIG. 14 shows B1s spectrum present on the interface between the WN film and the polycrystalline silicon film analyzed by X-ray photo-electron spectroscopy (XPS).

As shown in FIG. 13, boron introduced into the polycrystalline silicon film 106 is absorbed up by the WN film 108, and a high concentration of boron is present in the WN film 108. As shown in FIG. 14, a peak at the binding energy of 191 eV which corresponds to B—N bond can be observed at the interface between the WN film and the polycrystalline silicon film. Based on these results, it is considered that boron in the polycrystalline silicon film 106 is absorbed by the reaction layer between the WN film 108 and the polycrystalline silicon film 106 to form B—N bonds, whereby a boron concentration in the polycrystalline silicon film 106 is decreased to thereby depletion of the gate electrode 104 occur.

Then, the inventors of the present application groped for means for suppressing the absorption of boron by the reaction layer between the WN film and the polycrystalline silicon film. Resultantly, they considered it effective that a thin silicon film interposed between the polycrystalline silicon film and the WN film. They have succeeded in suppressing boron absorption of the reaction layer between the WN film and the polycrystalline silicon film.

It is considered that diffusion of boron toward the WN film is suppressed by providing silicon film between the polycrystalline silicon film and the WN film because native oxide film is formed between the polycrystalline silicon film and the silicon film. In the process in which the silicon film is formed after boron has been introduced into the polycrystalline silicon film, the wafer is exposed to the air between the step of forming the polycrystalline silicon film and the step of forming the silicon film, and native oxide film is formed on the surface of the polycrystalline silicon film. Even if a pre-treatment is made before the following formation of the silicon film, native oxide film is formed in the process up to the load of the wafer into a film forming system. It is difficult to completely remove the native oxide film between the polycrystalline silicon film and the silicon film.

The present invention utilizes the thus-formed native oxide film, so that the native oxide film formed between the polycrystalline silicon film and the silicon film suppresses diffusion of boron from the polycrystalline silicon film toward the silicon film, and accordingly the boron absorption by the WN film is decreased.

It is considered that the oxide film intervening between the polycrystalline silicon film and the silicon film, when too thick, increases contact resistance between the polycrystalline silicon film and the silicon film, and when too thin, reduces the effect of suppressing the diffusion of the boron. Accordingly, a thickness of the oxide film is preferably 0.5–1.5 nm.

The silicon film intervening between the polycrystalline silicon film and the WN film may be polycrystalline silicon film or amorphous silicon film. Preferably, the silicon film has a thickness of not less than about 5 nm. This is because when the silicon film has a thickness below about 5 nm, all the silicon film reacts with the WN film, and the suppression of the boron diffusion by the native oxide film is not sufficient. On the other hand, when the silicon film intervening between the polycrystalline silicon film and the WN film is too thick, supply of the boron from the polycrystalline silicon film to the silicon film is insufficient, and contact resistance between the silicon film and the WN film increases. There is a risk that especially AC characteristics may be affected. There is also a risk that over-etching of the WN film is stopped by the native oxide film, and the etching for forming the gate electrode may be complicated. Accordingly, it is preferable that a film thickness of the silicon film is set to be about 2–20 nm.

FIG. 1 is a graph of boron distributions in the gate electrodes of the Control without silicon film intervening and of the present invention (Example 1) with amorphous silicon film intervening measured by SIMS. For detailed conditions for fabricating the sample of the present invention (Example 1) used in this measurement, a first embodiment which will be described later is referred to. The sample of the Control was fabricated under the same fabrication conditions as those for the first embodiment except that the step of forming the amorphous silicon film is omitted.

As seen in FIG. 1, in Example 1 of the present invention with the amorphous silicon film (a-Si) intervening, the diffusion of boron toward the WN film is suppressed in comparison with the Control without amorphous silicon film intervening. Thus, in the present invention the boron concentration in the polycrystalline silicon film could be much increased.

In the present invention, a small peak is observed between the amorphous silicon film and the polycrystalline silicon film. This means that native oxide film is present in the interface. In other words, as means for confirming that the polycrystalline silicon film below the barrier metal was formed by plural times of deposition, measurement of boron concentration distribution by SIMS can be used. Oxygen of the native oxide film may be directly analyzed by SIMS.

However, in Example 1 shown in FIG. 1, the boron concentration near the surface of the silicon substrate is higher in comparison with that of the Control. This will be because a concentration of boron diffused into the silicon substrate was increased as a boron concentration near the interface was increased. The diffusion of boron into the inside of the silicon substrate affects changes of the flat band voltage, i.e., the threshold voltage of a transistor. It is preferable that the diffusion is suppressed as much as possible.

The crystal structure of the silicon films in contact with gate insulator is essential for reducing boron penetration into silicon substrate. In the case of polycrystalline silicon, the amount of boron penetration is smaller than in the case of amorphous silicon. Please note if polycrystalline silicon is used for this structure, amorphization using implantation of heavy ion such as Ge is needed before boron implantation, in order to suppress the boron penetration caused by channeling. The inventors presume the mechanism of suppressing boron penetration as follows.

Generally, the grain size of a polycrystalline silicon film deposited at the temperatures 600–650° C. is smaller than that of a poly-crystallized amorphous silicon film which is poly-crystallized by thermal processing at the temperatures around 800° C. The crystals in the former case grow in columns since boron atoms introduced into the polycrystalline silicon film easily diffuse toward the gate insulation film along the column in the grain boundaries. On the other hand, smaller grain size results in larger crystal grain boundary areas. Accordingly, the boron atoms more tend to be taken into the crystals than in large grain size polycrystalline silicon film such as poly-crystallized amorphous silicon film by thermal processing. Accordingly, it is considered that in the small grain polycrystalline silicon film, boron is diffused in a high concentration near the gate insulation film, but boron is taken into the polycrystalline silicon in a large quantity, so that a concentration of boron which is diffused into the silicon substrate 10 across the gate insulation film 12 can be low. It can be presumed based on this view that preferably the base polycrystalline silicon film has small crystal grain diameters.

The pre-amorphization of the polycrystalline silicon film is for suppressing the channeling of boron ions upon the doping. Accordingly, when the ions can be implanted at low energy of, e.g., 13 keV, the pre-amorphization of the polycrystalline silicon film is not essential because the punch-through of boron by the channeling into the inside of the silicon substrate can be suppressed.

FIG. 2 is a graph of boron distributions in the gate electrodes of a Control in which amorphous silicon film doped with boron is poly-crystallized to form the polycrystalline silicon film 106, and amorphous silicon film intervenes between the polycrystalline silicon film 106 and the WN film 108, and of the present invention (Example 2) in which polycrystalline silicon film is deposited and pre-amorphized, and doped with boron, and the amorphous silicon film intervenes between the polycrystalline silicon film 106 and the WN film 108. For detailed conditions for fabricating the sample of the present invention used in this measurement, a second embodiment which will be described later is referred to. The sample of the Control was fabricated under the same fabrication conditions as those for the first embodiment except that the step of forming the amorphous silicon film is omitted.

Polycrystalline silicon film is deposited and is pre-amorphized in place of depositing the amorphous silicon film, whereby, as shown in FIG. 2, a boron concentration in the silicon substrate near the interface with the gate insulation film can be decreased to be equal to that of the Control. Accordingly, change of a threshold voltage of a transistor can be suppressed.

The sample of Example 2 of the present invention shown in FIG. 2 has the polycrystalline silicon film of a 100 nm-thick, and the polycrystalline silicon film is thicker than the 70 nm-thick polycrystalline silicon film of the Control. However, the effect of suppressing the diffusion of boron into the silicon substrate does not result from decrease of the channeling owing to the increased film thickness of the polycrystalline silicon film. In comparison of the sample (Example 1 of the present invention in FIG. 1) with boron implanted in the 70 nm-thick polycrystalline silicon film with the sample (Example 2 of the present invention in FIG. 2) with boron implanted in the 100 nm-thick polycrystalline silicon film, the latter has a lower concentration of boron which has punched through into the gate silicon substrate even with a higher boron concentration in the polycrystalline silicon film near the gate insulation film than that of the former. Accordingly, it is considered that the effect of suppressing the diffusion of boron toward the silicon substrate results from a difference between a state of diffusion of boron in the polycrystalline silicon film and a state of diffusion of boron in the polycrystalline silicon film having amorphous silicon poly-crystallized.

FIG. 3 is a graph of results of C-V measurement of a conventional MOS capacitor as a Control, and MOS capacitors formed by the present invention as Examples 1 and 2. Depletion of the p polycrystalline silicon of the gate electrodes occur in negative biased region in FIG. 3. Thus, an index for evaluating depletion of a gate electrode can be measured accumulation (negative biased region) capacitances on a C-V curve. It is judged that depletion of the gate electrode is little as an accumulation capacitance is higher. The diffusion of boron toward the silicon substrate can be judged based on an inclination of the C-V curve near 0 V, and it is judged that as an inclination is blunter, i.e., as a flat band voltage is higher, the diffusion of boron toward the substrate is more.

As shown, Example 1 including an amorphous silicon film intervening between a WN film and a polycrystalline silicon film could have the increased accumulation capacitances in comparison with the Control and could suppress the diffusion of boron toward the substrate to the substantially equal levels.

FIG. 4 is a graph of results of measured Id-Vg characteristics of a conventional PMOSFET as a Control, and PMOSFETs formed by the present invention. As seen in the results of FIG. 3, in Example 1 shift of the threshold voltages is observed, and it can be observed that boron is diffused toward the silicon substrate. On the other hand, Example 2 of the present invention has substantially the same sub-threshold characteristic as the Control, and it is seen that the diffusion of boron toward the silicon substrate is suppressed.

The above-described object is attained by a semiconductor device comprising: a pair of impurity diffused regions formed in a silicon substrate, spaced from each other; and a gate electrode formed above the silicon substrate between the pair of impurity diffused regions intervening a gate insulation film therebetween, the gate electrode being formed of a first polycrystalline silicon film formed on the gate insulation film, a second polycrystalline silicon film formed on the first polycrystalline silicon film and having crystal grain boundaries which are discontinuous to the first polycrystalline silicon film, and a metal nitride film formed on the second polycrystalline silicon film.

The above-described object is also attained by a semiconductor device comprising: a pair of impurity diffused regions formed in a silicon substrate, spaced from each other; and a gate electrode formed above the silicon substrate between the pair of impurity diffused regions intervening a gate insulation film therebetween, the gate electrode being formed of a first polycrystalline silicon film formed on the gate insulation film, a second polycrystalline silicon film formed on the first polycrystalline silicon film and having crystal grain boundaries which are discontinuous to the first polycrystalline silicon film, a metal nitride film formed on the second polycrystalline silicon film, and a metal film form on the metal nitride film.

In the above-described semiconductor device, it is possible that a native oxide film is formed between the first polycrystalline silicon film and the second polycrystalline silicon film.

In the above-described semiconductor device, it is possible that the first polycrystalline silicon film is doped with boron.

In the above-described semiconductor device, it is possible that the first polycrystalline silicon film and the second polycrystalline silicon film are doped with boron, a boron concentration in the first polycrystalline silicon film near an interface between the first polycrystalline silicon film and the second polycrystalline silicon film is higher than a boron concentration in the second polycrystalline silicon film near the interface between the first polycrystalline silicon film and the second polycrystalline silicon film.

In the above-described semiconductor device, it is possible that a crystal grain size of the first polycrystalline silicon film is smaller than a crystal grain size of the second polycrystalline silicon film.

The above-described object is also attained by a method for fabricating a semiconductor device comprising the steps of: forming a gate insulation film on a silicon substrate; forming a first silicon film doped with boron on the gate insulation film; forming a second silicon film on the first silicon film; forming a metal nitride film on the second silicon film; forming a metal film on the metal nitride film; and patterning a layered structure of the first silicon film, the second silicon film, the metal nitride film and the metal film to form a gate electrode of the layered structure.

In the above-described method for fabricating a semiconductor device, it is possible that the step of forming the first silicon film includes the step of forming a polycrystalline silicon film on the gate insulation film and the step of doping boron in the polycrystalline silicon film.

In the above-described method for fabricating a semiconductor device, it is possible that the method further comprises between the step of forming the polycrystalline silicon film and the step of doping boron, the step of amorphizing the surface of the polycrystalline silicon film.

In the above-described method for fabricating a semiconductor device, it is possible that the step of forming the first silicon film includes the step of forming an amorphous silicon film on the gate insulation film and the step of doping boron in the amorphous silicon film.

In the above-described method for fabricating a semiconductor device, it is possible that in the step of forming the second silicon film, the second silicon film is formed on the first silicon film intervening a native oxide film therebetween.

In the above-described method for fabricating a semiconductor device, it is possible that the method further comprises between the step of forming the first silicon film and the step of forming the second silicon film, the step of thermal processing to activate the boron doped in the first silicon film.

In the above-described method for fabricating a semiconductor device, it is possible that in the step of forming the second silicon film, the second silicon film is formed in a 2–20 nm-thick.

DETAILED DESCRIPTION OF THE INVENTION

[A First Embodiment]

The semiconductor device according to a first embodiment of the present invention and the method for fabricating the semiconductor device will be explained with reference to FIGS. 5, 6A–6D, 7A–7C, 8A–8B and 9A–9B.

Figure 5:
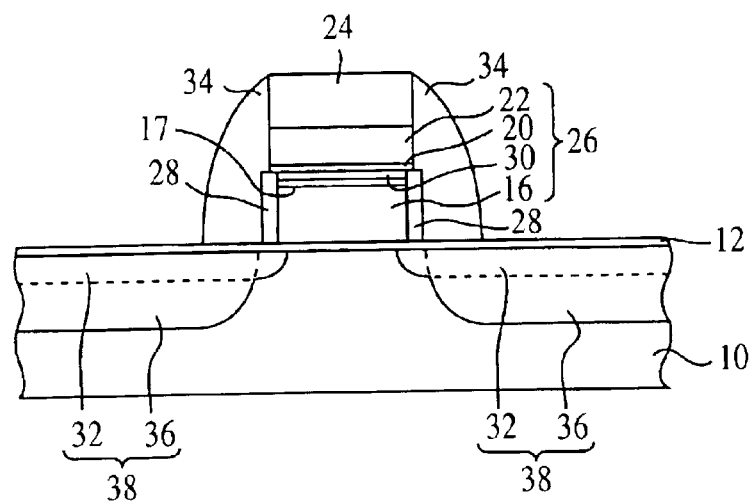
FIG. 5 is a diagrammatic sectional view of the semiconductor device according to a first embodiment of the present invention, which shows a structure thereof.

First, a structure of the semiconductor device according to the present embodiment will be explained with reference to FIG. 5.

A gate electrode 26 is formed on a silicon substrate 10 intervening a gate insulation film 12 therebetween. The gate electrode 26 has a layered structure of polycrystalline silicon films 16, 30 formed on the gate insulation film 12, a WN film 20 formed on the polycrystalline silicon film 30, and a W film 22 formed on the WN film 20. The WN film 20 is a barrier metal for preventing the polycrystalline silicon film 30 and the W film 22 from reacting with each other to thereby form tungsten silicide of high resistance. A cap film of a silicon nitride film 24 is formed on the gate electrode 26. A silicon oxide film 28 for removing damage in patterning the gate electrode 26 is formed on the side walls of the polycrystalline silicon films 16, 30. A sidewall insulation film 34 is formed on the side walls of the gate electrode 26 and the silicon nitride film 24. A source/drain diffused layer 38 including a dopant diffused region 32 and a dopant diffused region 36 is formed in the silicon substrate 10 on both sides of the gate electrode 26.

The semiconductor device according to the present embodiment is characterized in that the polycrystalline silicon film formed on the gate insulation film 12 is formed of the polycrystalline silicon film 16 which is thicker and the polycrystalline silicon film 30 which is thinner, and the crystal grain boundaries of the polycrystalline silicon film 16 are not continuous to those of the polycrystalline silicon film 30. The discontinuity between the crystal grain boundaries of the polycrystalline silicon film 16 and the polycrystalline silicon film 30 is due to different thermal processing steps for the films. Such difference in the crystal grain diameter can be confirmed, e.g., by the cross-sectional observation by a transmission electron microscope (TEM), the boron concentration distribution measurement by SIMS or others.

The semiconductor device according to the present embodiment will be detailed along the method for fabricating the semiconductor device according to the present embodiment.

Figure 6A:
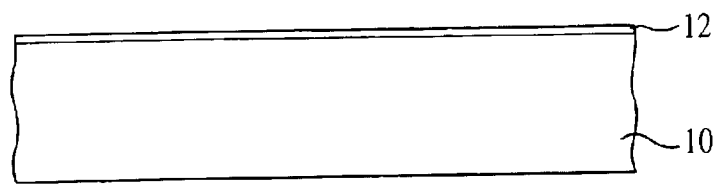
FIGS. 6A–6D are sectional views of the semiconductor device according to the first embodiment in the steps of the method for fabricating the semiconductor device, which show the method (Part 1).
Figure 6B:
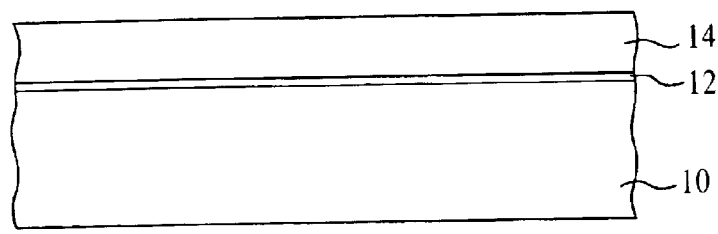

First, the gate insulation film 12 of a 4 nm-thick silicon oxide film containing nitrogen by about some % is formed on a silicon substrate 10 by, e.g., thermal oxidation (FIG. 6A).

Then, the amorphous silicon film 14 of a 70 nm-thick is formed by, e.g., CVD method on the silicon substrate 10 with the gate insulation film 12 formed on.

Figure 6C:
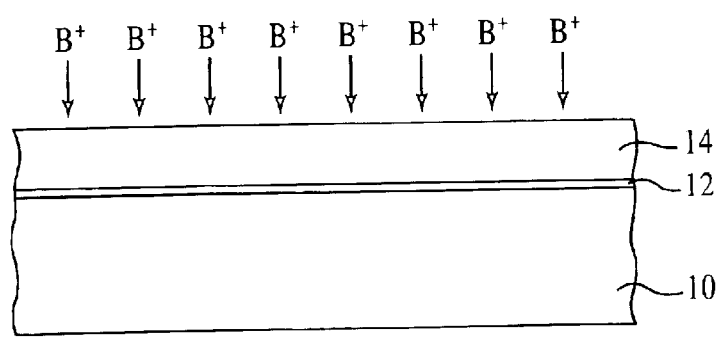

Then, boron ions as an acceptor impurity are implanted into the amorphous silicon film 14 by ion implantation (FIG. 6C). Boron ions are implanted, e.g., with 5 keV acceleration energy and at a $2\times10^{15}$ cm$^{-2}$ dose. Boron is implanted in the amorphous silicon film 14, and the channeling of the implanted ions is suppressed. In place of depositing the non-doped amorphous silicon film 14 and then implanting boron, the amorphous silicon film 14 doped with boron may be deposited.

Then, thermal processing, e.g., in a nitrogen atmosphere, at 800° C. and for 30 minutes follows. This thermal processing is for crystallizing the amorphous silicon film 14 to activate the implanted boron while diffusing the implanted boron sufficiently near the gate insulation film 12. This thermal processing lower a boron concentration near the WN film 12, which will be deposited later, and boron which will transit toward the WN film 20 can be decreased. In the following explanation, the crystallized amorphous silicon film 14 is called the polycrystalline silicon film 16.

Figure 6D:
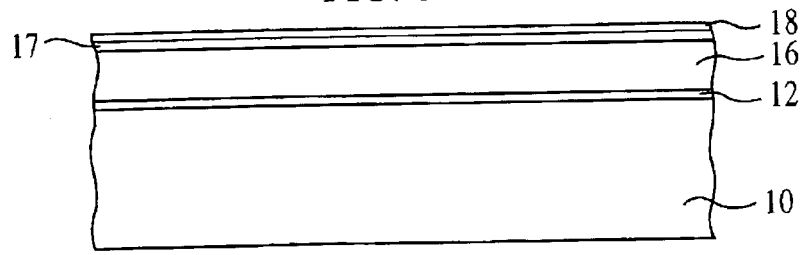

Next, the amorphous silicon film 18 is formed in a 10 nm-thick on the polycrystalline silicon film 16 by, e.g., CVD method (FIG. 6D). At this time a native oxide film 17 is formed between the polycrystalline silicon film 16 and the amorphous silicon film 18.

Then, the WN film 20 is deposited in a 5 nm-thick on the amorphous silicon film 18 by, e.g., sputtering method.

A higher boron concentration is preferable between the amorphous silicon film 18 and the WN film 20 in consideration of contact resistance between the amorphous silicon film 18 and the WN film 20. From this viewpoint, boron may be implanted into the amorphous silicon film 18 after the amorphous silicon film 18 has been deposited and before the WN film 20 is deposited, if necessary.

Figure 7A:
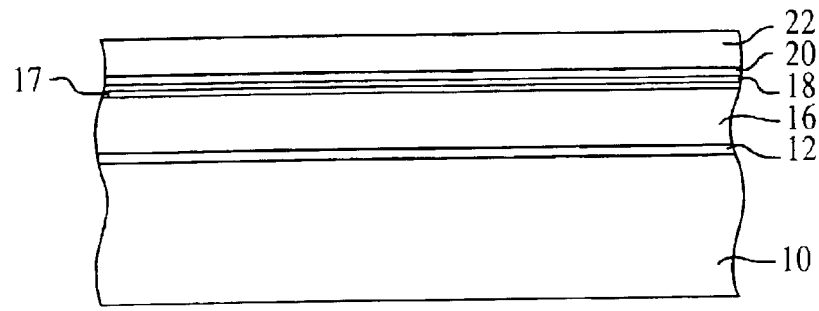
FIGS. 7A–7C are sectional views of the semiconductor device according to the first embodiment in the steps of the method for fabricating the semiconductor device, which show the method (Part 2).
Figure 7B:
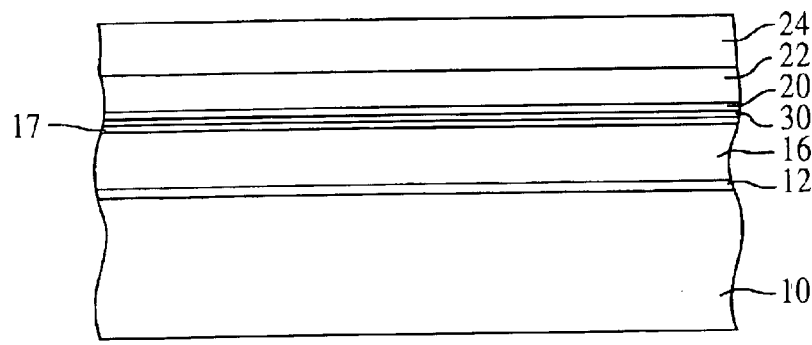

Then, the W film 22 is formed in a 40 nm-thick on the WN film 20 by, e.g., sputtering method. Then, the silicon nitride film 24 is formed in a 100 nm-thick on the W film 22 by, e.g., CVD method. At this time, the thermal processing in the film forming process crystallizes the amorphous silicon film 18 to be the polycrystalline silicon 30 (FIG. 7B).

Figure 1:
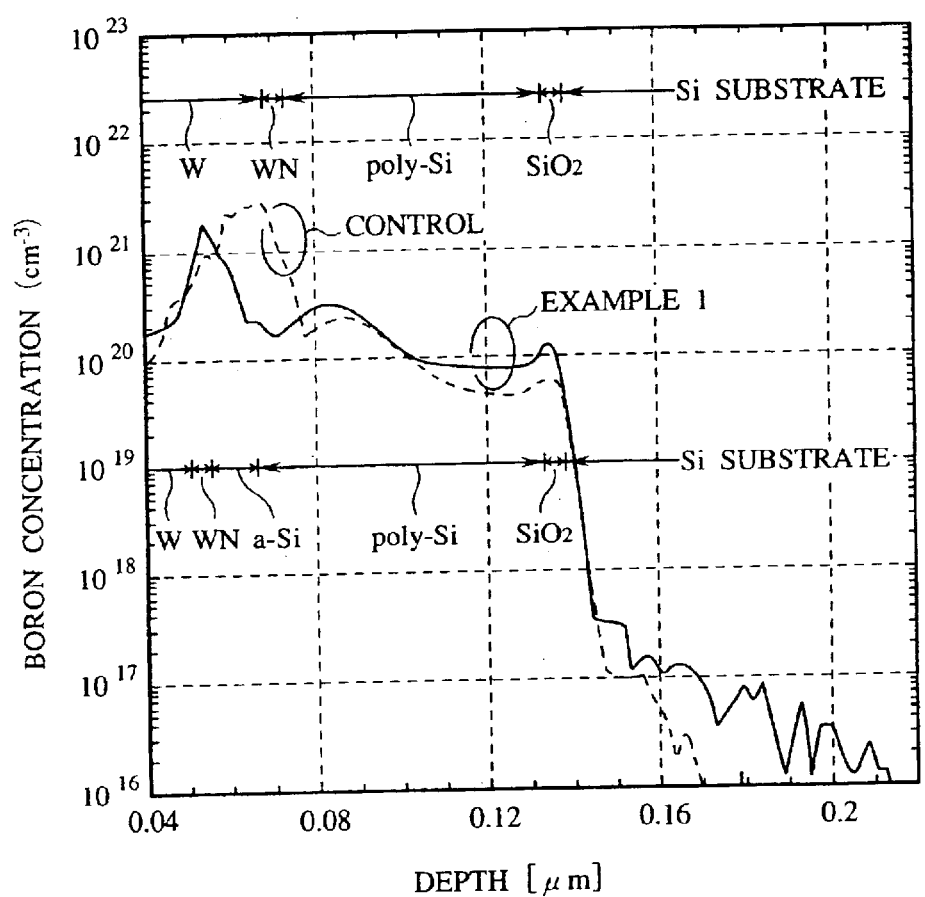
FIG. 1 is a graph of boron distributions in the gate electrodes of the semiconductor device according to the present invention and the conventional semiconductor device (Part 1).

The boron in the polycrystalline silicon film 16 is thermally diffused in this step and the following thermal processing steps, but the diffusion of the boron from the polycrystalline silicon film 16 toward the polycrystalline silicon film 30 is suppressed by the native oxide films (not shown) formed between the polycrystalline silicon film 16 and the polycrystalline silicon film 30. As a result, a boron concentration in the polycrystalline silicon film 16 near the interface between the polycrystalline silicon film 16 and the polycrystalline silicon film 30 is higher than that in the polycrystalline silicon film near the interface, whereby the boron absorption of the WN film 20 is reduced, and a boron concentration in the polycrystalline silicon film 16 can made higher (see FIG. 1).

Figure 7C:
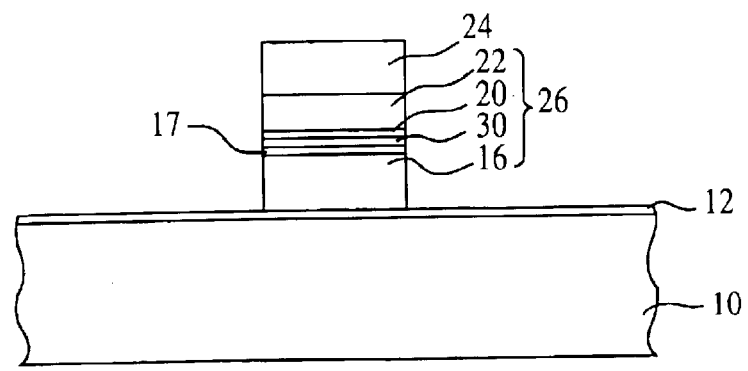

Then, the silicon nitride film 24, the W film 22, the WN film 20, the polycrystalline silicon film 30 and the polycrystalline silicon film 16 are patterned by the usual lithography and etching to form the gate electrode 26 of the polymetal structure which is formed of the layer film of the polycrystalline silicon films 16, 30, the WN film 20 and the W film 22 having the upper surface covered with the silicon nitride film 24 (FIG. 7C).

Figure 8A:
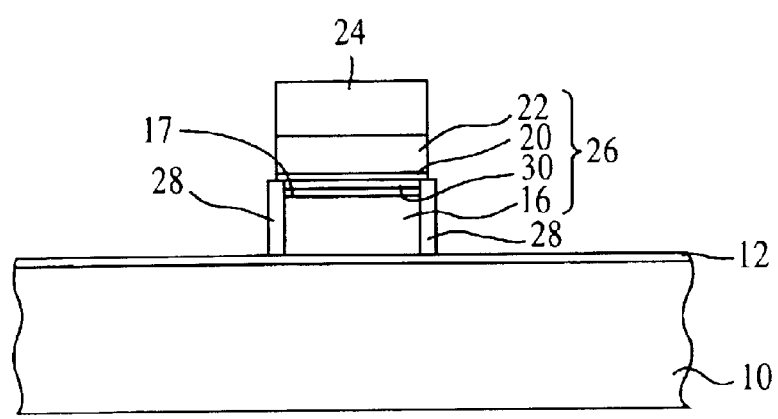
FIGS. 8A and 8B are sectional views of the semiconductor device according to the first embodiment in the steps of the method for fabricating the semiconductor device, which show the method (Part 3).

Then, thermal process is performed, e.g., in an atmosphere containing hydrogen and steam, at 800° C. and for 60 minutes to selectively oxidize the side walls alone of the polycrystalline silicon films 16, 30 without oxidizing the W film 22 and the WN film 20 to thereby form the silicon oxide film 28. The silicon oxide film 28 is for removing etching damage caused in the gate insulation film 12 at the edge of the gate electrode 26 in patterning the gate electrode 26 (FIG. 8A).

Figure 8B:
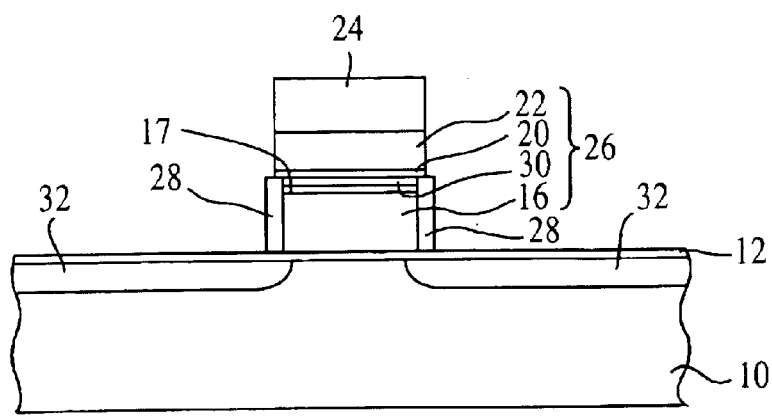

Next, with the gate electrode 26 as a mask, BF$_2$ ions are implanted, e.g., at 5 keV acceleration energy and a $5\times10^{14}$ cm$^{-2}$ dose to form in the silicon substrate 10 on both sides of the gate electrode 26 the impurity diffused layer 32 which is to a low-concentration region of an LDD structure or a shallow region of an extension source/drain structure (FIG. 8B).

Figure 9A:
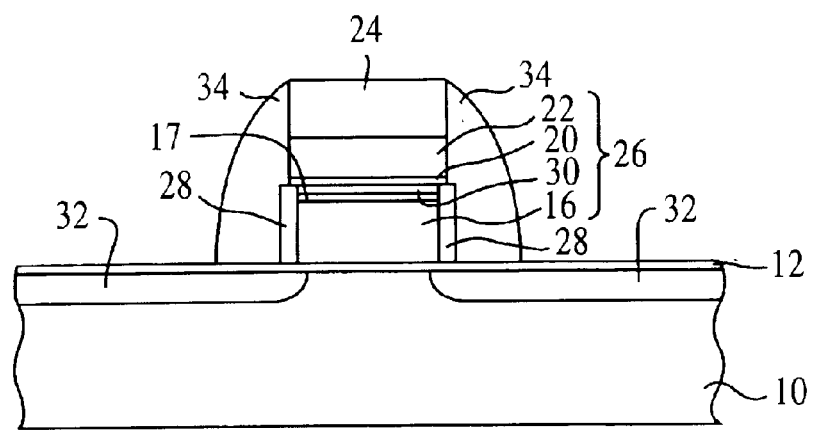
FIGS. 9A and 9B are sectional views of the semiconductor device according to the first embodiment in the steps of the method for fabricating the semiconductor device, which show the method (Part 4).

Then, a 60 nm-thick silicon nitride film is deposited on the entire surface by, e.g., CVD method and etched back to form the sidewall insulation film 34 of the silicon nitride film on the side walls of the gate electrode 26 and the silicon nitride film 24 (FIG. 9A).

Then, with the gate electrode 26 and the sidewall insulation film 34 as a mask, for example, boron ions, are implanted at 5 keV acceleration energy and a $2\times10^{15}$ cm$^{-2}$ to form the impurity diffused region 36, which is to be a heavily doped region of an LDD structure or a deep region of an extension source/drain structure.

Figure 9B:
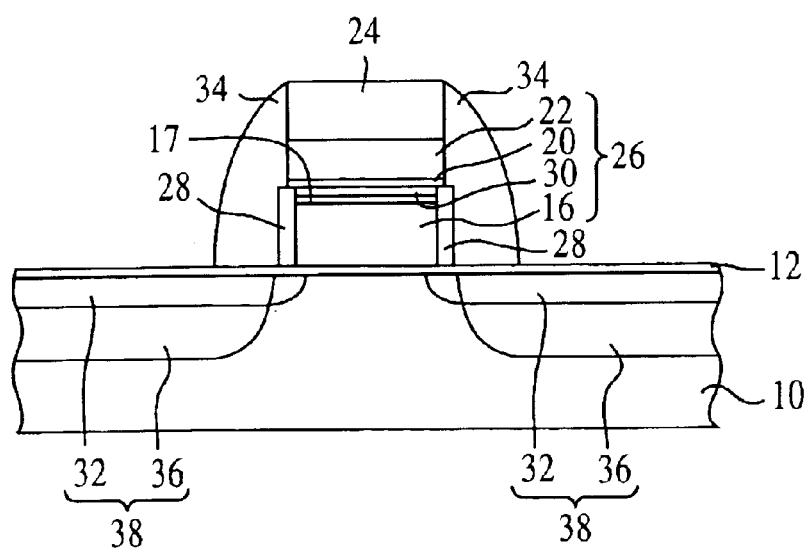

Next, in a nitrogen atmosphere thermal processing is performed, e.g., at 950° C. for 10 seconds to activate the boron ions introduced into the impurity diffused regions 32, 36 to form the source/drain diffused layer 38 (FIG. 9B).

Thus, the PMOSFET including the gate electrode 26 of the polymetal structure is formed.

As describe above, according to the present embodiment, after the polycrystalline silicon film 16 with boron implanted is formed and before the WN film 20 is formed, the amorphous silicon film 18 intervenes between the polycrystalline silicon film 16 and the WN film 20, whereby the diffusion of the boron from the polycrystalline silicon film toward the WN film 20 can be decreased. Thus, the depletion of the gate electrode 26 can be suppressed.

[A Second Embodiment]

The method for fabricating the semiconductor device according to the second embodiment of the present invention will be explained with reference to FIGS. 10A–10D and 11A–11C. The same members of the semiconductor device according to the first embodiment of the present invention and the method for fabricating the same are represented by the same reference numbers as those of the first embodiment not to repeat or to simplify their explanation. FIGS. 10A–10D and 11A–11C are sectional views of the semiconductor device according to the present embodiment in the steps of the method for fabricating the same, which show the method.

Figure 10A:
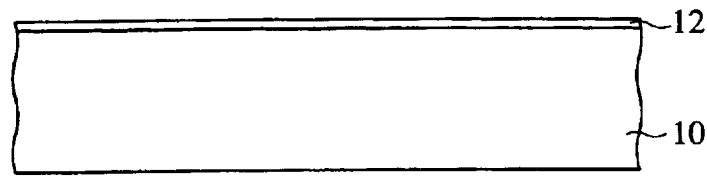
FIGS. 10A–10D are sectional views of the semiconductor device according to a second embodiment in the steps of the method for fabricating the semiconductor device, which show the method (Part 1).

First, on a silicon substrate 10, a gate insulation film 12 of a 4 nm-thick silicon oxide film containing nitrogen by some percentage is formed by, e.g., thermal oxidation (FIG. 10A).

Figure 10B:
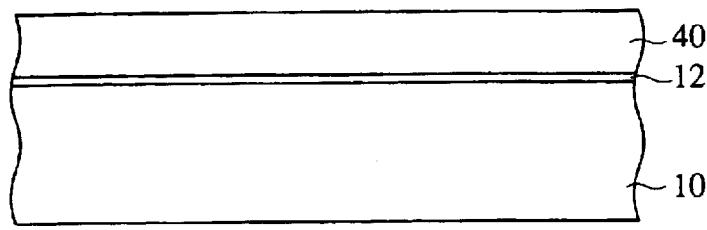

Next, a 100 nm-thick polycrystalline silicon film 40 is formed by, e.g., CVD method on the silicon substrate 10 with the gate insulation film 12 formed on (FIG. 10B).

Figure 10C:
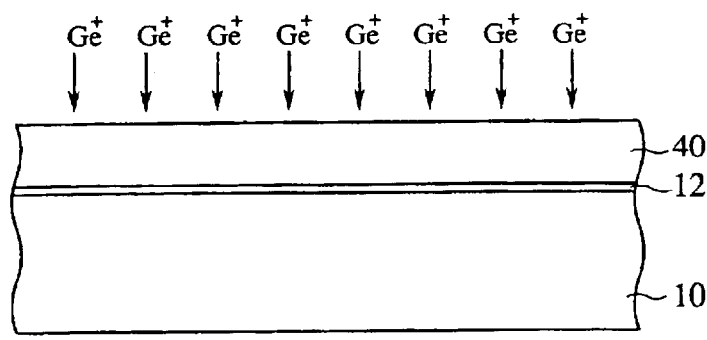

Then, the surface of the polycrystalline silicon film 40 is amorphized by ion implantation (FIG. 10C). The surface of the polycrystalline silicon film 40 may be amorphized by, e.g., implanting Ge ions, e.g., at 10 keV acceleration energy and at a $5 \times 10^{14}$ cm$^{-2}$ dose. In pre-amorphizing the surface of the polycrystalline silicon film 40 with Ge ions, it is preferable that a dose is about $5 \times 10^{14}$ cm$^{-2}$ at most. When too much Ge is introduced into the polycrystalline silicon film 40, the activation of boron is accelerated by B—Ge bonds in the polycrystalline silicon film 40 on the upper side, and the boron concentration is decreased near the interface with the gate insulation film 12.

Figure 10D:
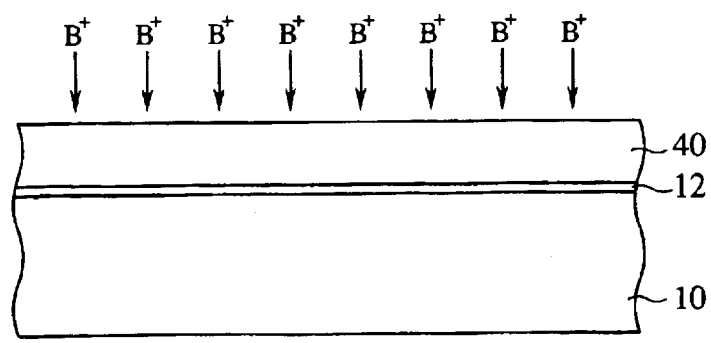

Next, boron ions as an acceptor impurity are introduced into the polycrystalline silicon film by ion implantation (FIG. 10D). At this time, the surface of the polycrystalline silicon film 40 has been amorphized, and the channeling of the implanted ions is suppressed. In place of implanting boron after the non-doped polycrystalline silicon film 40 is deposited, the polycrystalline silicon film doped with boron may be deposited.

Figure 2:
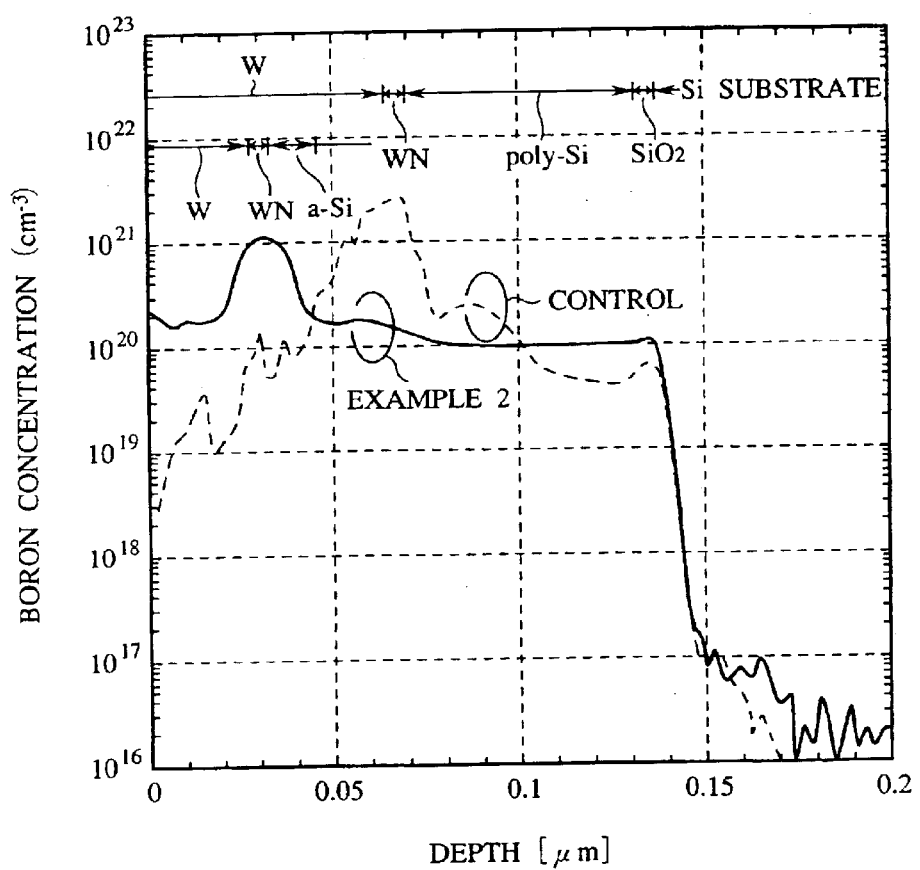
FIG. 2 is a graph of boron distributions in the gate electrodes of the semiconductor device according to the present invention and the conventional semiconductor device (Part 2).
Figure 3:
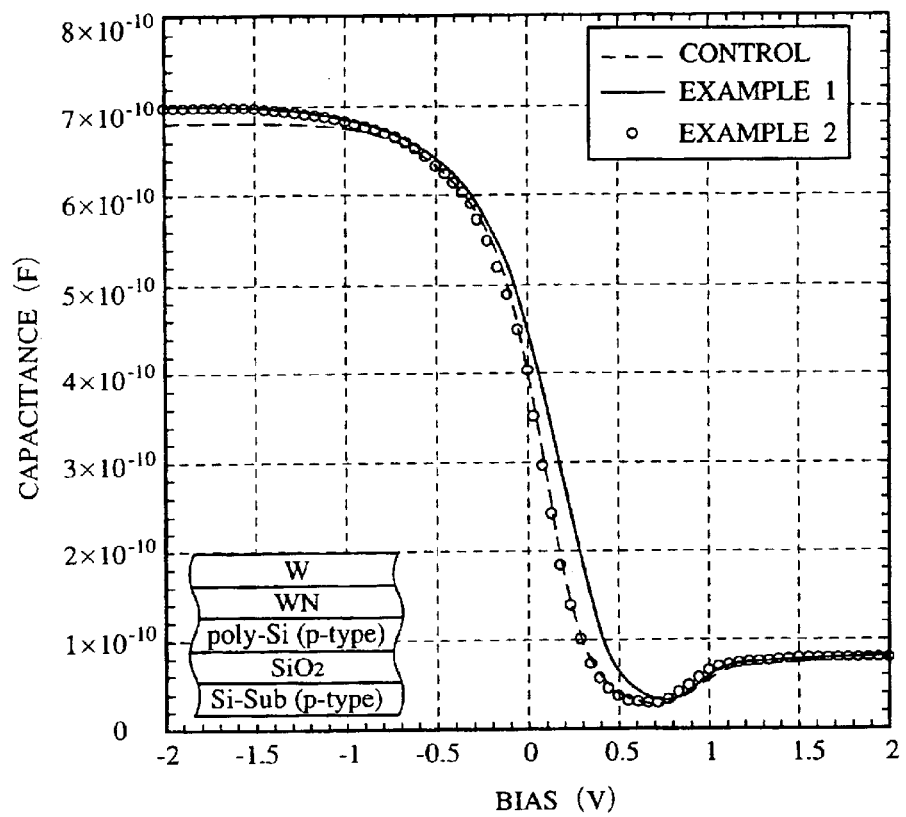
FIG. 3 is a graph of results of C-V measurement of the semiconductor device according to the present invention and the conventional semiconductor device.
Figure 4:
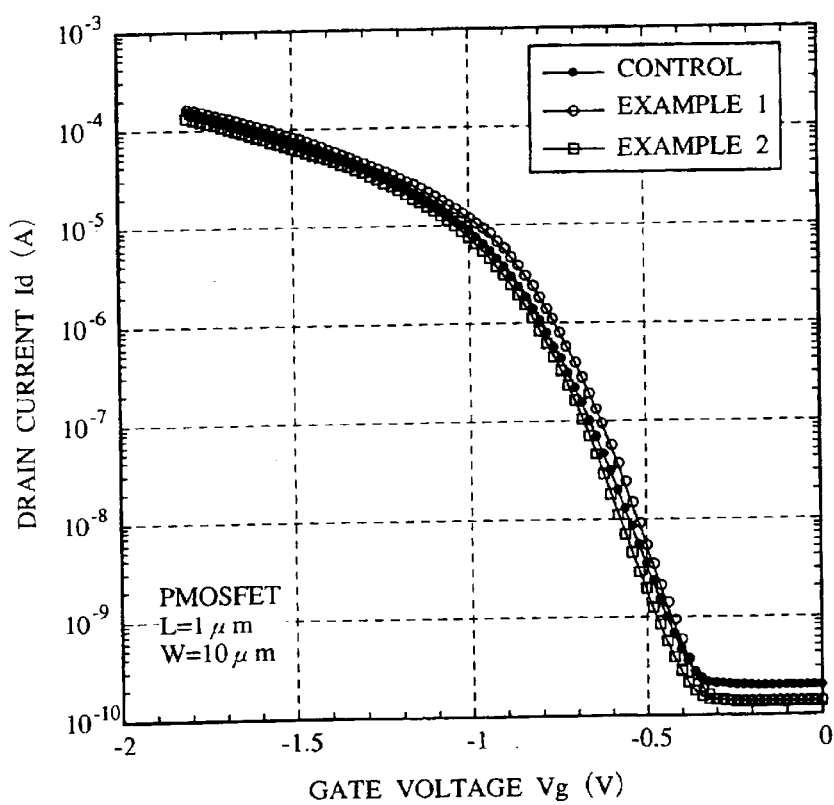
FIG. 4 is a graph of Id-Vg characteristics of PMOSFETs of the semiconductor device according to the present invention and the PMOSFET of the conventional semiconductor device.

Then, thermal processing is performed, e.g., in a nitrogen atmosphere at 800° C. for 30 minutes. This thermal processing is for activating the boron implanted in the polycrystalline silicon film 40 while sufficiently diffusing the boron up to the vicinity of the gate insulation film 12. This thermal processing decreases the boron concentration near a WN film 20 which will be deposited later and can decrease boron which will transit toward the WN film 20. Because the polycrystalline silicon film 40 is not deposited in the amorphous state, the diffusion of the boron in the polycrystalline silicon film 40 into the silicon substrate 10 by this thermal processing and later thermal processing steps can be suppressed (see FIG. 2).

Figure 11A:
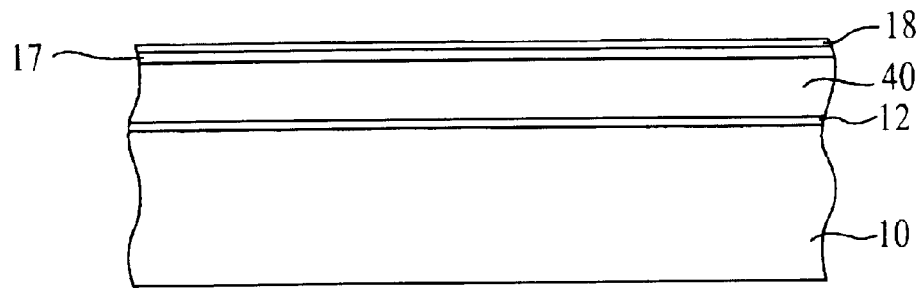
FIGS. 11A–11C are sectional views of the semiconductor device according to the second embodiment in the steps of the method for fabricating the semiconductor device, which show the method (Part 2).

Next, a 10 nm-thick amorphous silicon film 18 is formed on the polycrystalline silicon film 40 by, e.g., CVD method (FIG. 11A). At this time, a native oxide film is present between the polycrystalline silicon film 40 and the amorphous silicon film 18.

Then, a 5 nm-thick WN film 20 is formed on the amorphous silicon film 18 by, e.g., sputtering method.

Next, a 40 nm-thick W film 22 is formed on the WN film 20 by, e.g., sputtering method.

Figure 11B:
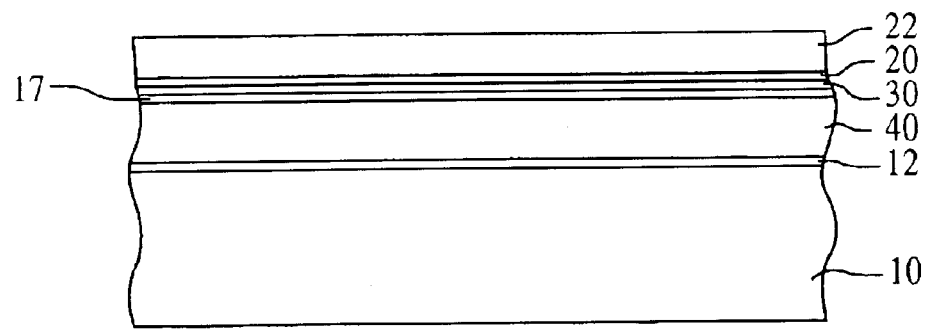

Then, a 100 nm-thick silicon nitride film 24 is formed on the W film 22 by, e.g., CVD method. At this time, the amorphous silicon film 18 is crystallized by the thermal processing of this film forming step to be a polycrystalline silicon film 30 (FIG. 11B). In forming the polycrystalline silicon films 40, 30 by this fabrication method, crystal grain diameters of the polycrystalline silicon film 40 are smaller than those of the polycrystalline silicon film 30.

Figure 11C:
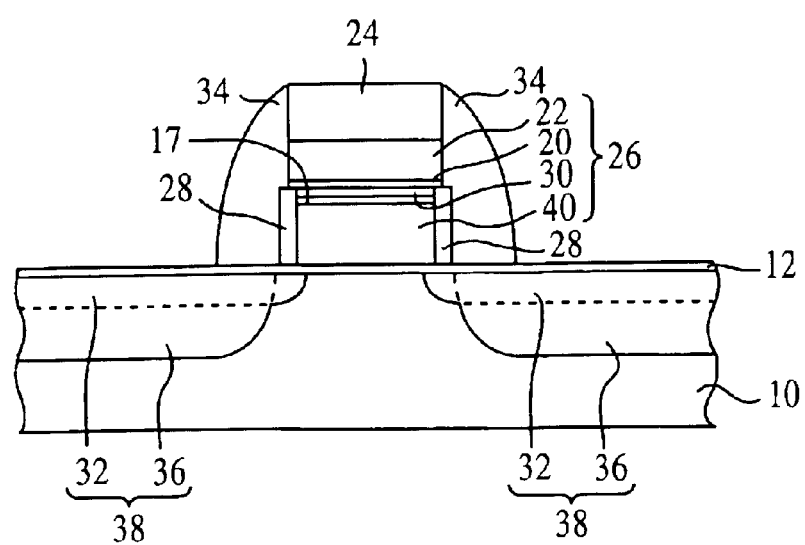
Figure 12:
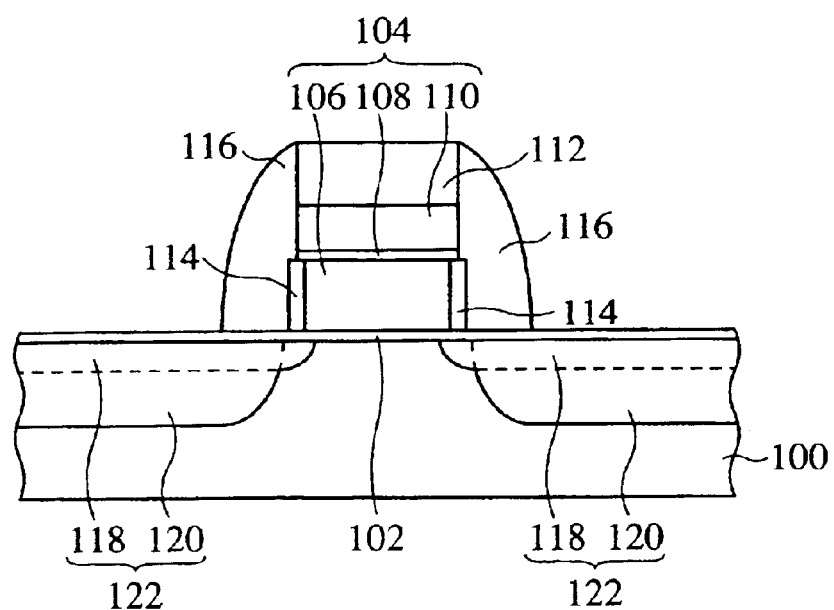
FIG. 12 is a diagrammatic sectional view of the conventional semiconductor device, which shows the structure thereof.
Figure 13:
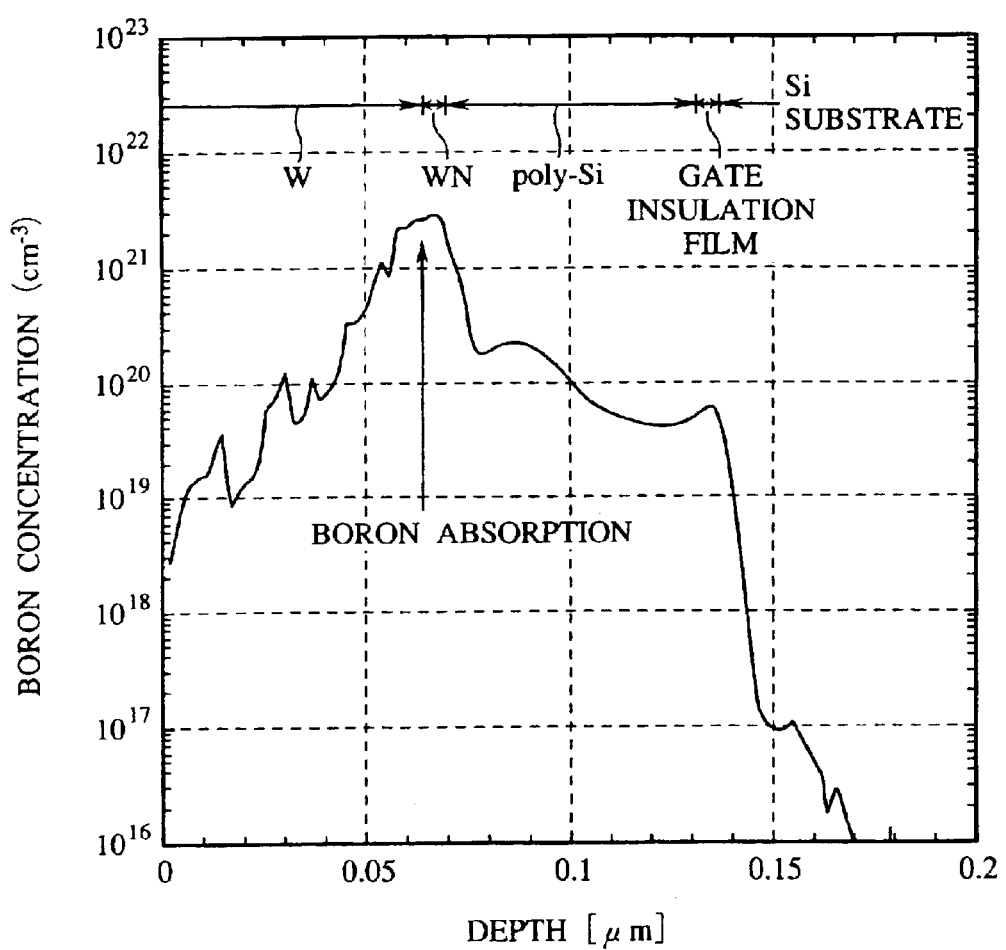
FIG. 13 is a graph of a boron distribution in the gate electrode of the conventional semiconductor device.
Figure 14:
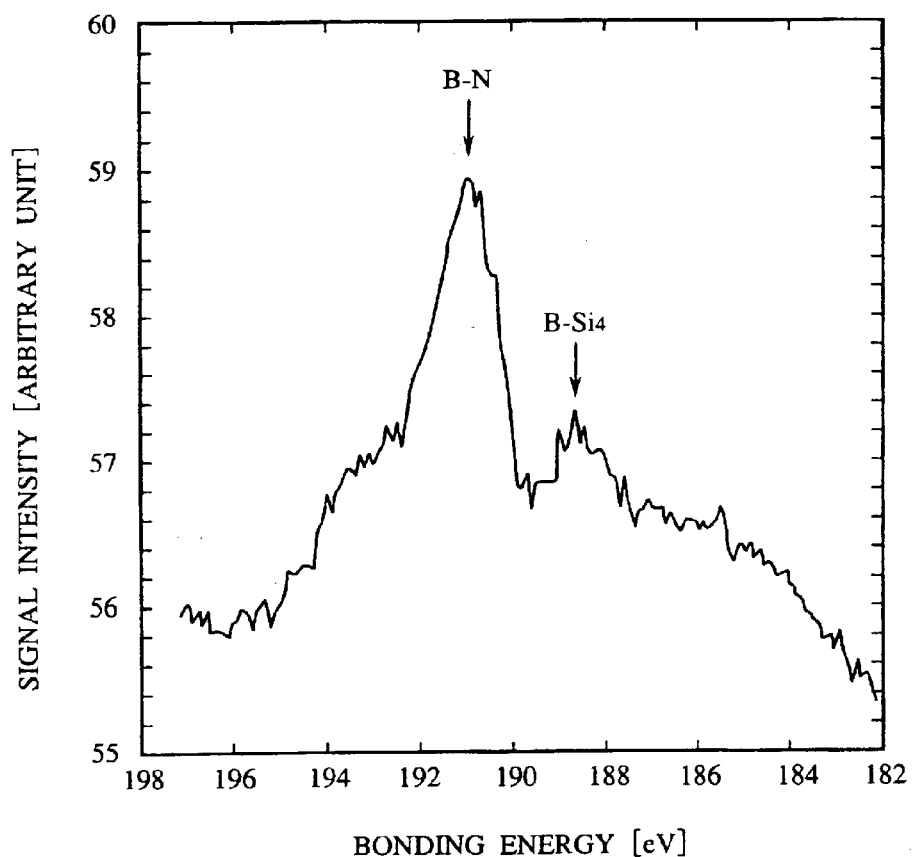
FIG. 14 is a graph of bonding states of boron in the gate electrode of the conventional semiconductor device.

Next, in the same way as in the method for fabricating the semiconductor device according to the first embodiment shown in FIGS. 7A to 9B, a PMOSFET including a gate electrode 26 of the polymetal structure of the layer films of the polycrystalline silicon films 40, 30, the WN film 20 and the W film 22 (FIG. 11C).

As described above, according to the present embodiment, after boron is introduced into the polycrystalline silicon film 40 and before the WN film 20 is formed, the amorphous silicon film 18 intervenes between the polycrystalline silicon film 40 and the WN film 20, whereby diffusion of the boron from the polycrystalline silicon film 40 toward the WN film 20 can be decreased. Thus, the depletion of the gate electrode 26 can be suppressed.

Boron is not doped with the amorphous silicon film 14 deposited, but is doped with the polycrystalline silicon film 40 deposited, whereby diffusion of the boron into the silicon substrate 10 by later thermal processing can be suppressed.

In the present embodiment, WN film is used as the barrier metal. The absorption of the boron by the barrier metal is caused by formation of bonds between the boron with the nitrogen. Accordingly, the present invention is applicable to MOSFETs including the barrier metals consisting of other nitride materials, e.g., MoN (molybdenum nitride), TiN (titanium nitride), VN (vanadium nitride), CrN (chrome nitride), CuN (copper nitride), FeN (iron nitride), ZnN (zinc nitride), NiN (nickel nitride), etc.

In the present embodiment, for suppressing diffusion of the boron toward the barrier metal, native oxide films formed between the polycrystalline silicon film and the amorphous silicon film are used. In addition to the use of the native oxide film, a step of positively oxidizing the surface of the polycrystalline silicon film after the polycrystalline silicon film is formed and before the amorphous silicon film is formed may be provided. A thin silicon oxide film of a film thickness equal to the native oxide films can be formed by, e.g., liquid chemical treatment, as of hydrochloric acid, or rapid thermal oxidation.

In the present embodiment, Ge ions are used for pre-amorphizing the polycrystalline silicon film, but Ge ions are not essential. For example, ions of IV Group, such as Ge (germanium), Si, Sn (tin), ions of III Group, such as Ga (gallium), In (indium), etc., ions of inactive gases, such as Ar (argon), Kr (krypton), and ions of halogen group, such as I (iodine), Cl (chlorine), Br (bromine), etc. can be used. Ions of V Group, which can amorphize the polycrystalline silicon film by relatively low dosage, such as As (arsenic), Sb (antimony), etc., can be also used.

As described above, according to the present invention, after boron is implanted in the amorphous silicon film or the polycrystalline silicon film, and before the barrier metal of a metal consisting of a nitride is formed, the silicon film intervenes between the film and the barrier metal, whereby diffusion of the boron from the lower polycrystalline silicon film toward the barrier metal can be decreased. Thus, depletion of the gate electrode can be suppressed.

In forming the lower polycrystalline silicon film, an amorphous silicon film is not deposited, but a polycrystalline silicon film is deposited, and boron is doped into the polycrystalline silicon film, whereby diffusion of the boron toward the silicon substrate by later thermal processing can be suppressed.

What is claimed is:

1. A method for fabricating a semiconductor device comprising the steps of:
   forming a gate insulation film on a silicon substrate;
   forming a first silicon film doped with boron on the gate insulation film;

forming a second silicon film on the first silicon film;

forming a metal nitride film on the second silicon film;

forming a metal film on the metal nitride film; and patterning a layered structure of the first silicon film, the second silicon film, the metal nitride film and the metal film to form a gate electrode of the layered structures, wherein the method further comprises between the step of forming the first silicon film and the step of forming the second silicon film, the step of thermal processing to activate the boron doped in the first silicon film.

2. A method for fabricating a semiconductor device according to claim 1, wherein the step of forming the first silicon film includes the step of forming a polycrystalline silicon film on the gate insulation film and the step of doping boron in the polycrystalline silicon film.

3. A method for fabricating a semiconductor device according to claim 2, further comprising between the step of forming the polycrystalline silicon film and the step of doping boron, the step of amorphizing the surface of the polycrystalline silicon film.

4. A method for fabricating a semiconductor device according to claim 1, wherein the step of forming the first silicon film includes the step of forming an amorphous silicon film on the gate insulation film and the step of doping boron in the amorphous silicon film.

5. A method for fabricating a semiconductor device according to claim 1, wherein in the step of forming the second silicon film, the second silicon film is formed on the first silicon film intervening a native oxide film therebetween.

6. A method for fabricating a semiconductor device according to claim 1, wherein in the step of forming the second silicon film, the second silicon film is formed in a 2–20 nm-thick.

* * * * *